United States Patent
Chung

(10) Patent No.: US 9,420,694 B2
(45) Date of Patent: Aug. 16, 2016

(54) METHOD FOR CONTROLLING WARPAGE WITHIN ELECTRONIC PRODUCTS AND AN ELECTRONIC PRODUCT

(75) Inventor: Kwan Sik Chung, SungNam-Si (KR)

(73) Assignee: GE Embedded Electronics Oy, Helsinki (FI)

( * ) Notice: Subject to any disclaimer, the term of this patent is extended or adjusted under 35 U.S.C. 154(b) by 61 days.

(21) Appl. No.: 12/872,538

(22) Filed: Aug. 31, 2010

(65) Prior Publication Data
US 2012/0048605 A1    Mar. 1, 2012

(51) Int. Cl.
 *H05K 3/36*     (2006.01)
 *H05K 1/18*     (2006.01)
 *H01L 23/498*   (2006.01)
 *H01L 23/538*   (2006.01)
 *H05K 3/46*     (2006.01)

(52) U.S. Cl.
 CPC .......... *H05K 1/188* (2013.01); *H01L 23/49822* (2013.01); *H01L 23/5389* (2013.01); *H01L 23/49827* (2013.01); *H01L 2224/24* (2013.01); *H05K 3/4626* (2013.01); *H05K 2201/09136* (2013.01); *H05K 2203/063* (2013.01); *Y10T 29/49126* (2015.01); *Y10T 29/49155* (2015.01)

(58) Field of Classification Search
 CPC .................. H05K 3/0011; H05K 2201/09136; H01L 23/53295; Y10T 29/49155; Y10T 29/49126; Y10T 29/49165; Y10T 29/49124; Y10T 29/49117; Y10T 29/49002
 USPC .............................. 29/846, 830; 174/258, 260
 See application file for complete search history.

(56) References Cited

U.S. PATENT DOCUMENTS

| 6,770,547 B1* | 8/2004 | Inoue | H01L 21/563 257/E21.503 |
| 7,879,438 B2* | 2/2011 | Lin | C04B 35/62218 156/89.11 |
| 2010/0084748 A1 | 4/2010 | Poddar et al. | |
| 2011/0061922 A1* | 3/2011 | Lee | H01L 23/13 174/261 |
| 2012/0171850 A1* | 7/2012 | Honaga | H01L 23/544 438/478 |

FOREIGN PATENT DOCUMENTS

| KR | 2009-0029582 A | 3/2009 |
| TW | 269459 B1 * | 12/2006 |

* cited by examiner

*Primary Examiner* — Peter DungBa Vo
*Assistant Examiner* — Azm Parvez
(74) *Attorney, Agent, or Firm* — Seppo Laine Oy

(57) ABSTRACT

The present invention discloses a method for minimizing warpage in the electronic products, and the structures of such electronic products as well. Groove holes are formed into the insulating material layer or several layers. The groove holes can be processed by laser drilling or by other suitable means. A cured epoxy adhesive will fill the groove holes after the heat and pressure treatment performed to the circuit structure. The electronic product may contain several insulating layers and embedded electronic components connected to a wiring layer. A double-stacked symmetrical structure can also be manufactured. Asymmetrical structures with different sized embedded components can be handled as well. The groove holes can be shaped as straight short lines, ellipses, crosses, circles etc, or as any combination of different shapes. The groove holes can be scratched so that they locate outside strips, between the strips of a panel, between blocks of the strip, between modules of the block or between embedded components of the module.

10 Claims, 9 Drawing Sheets

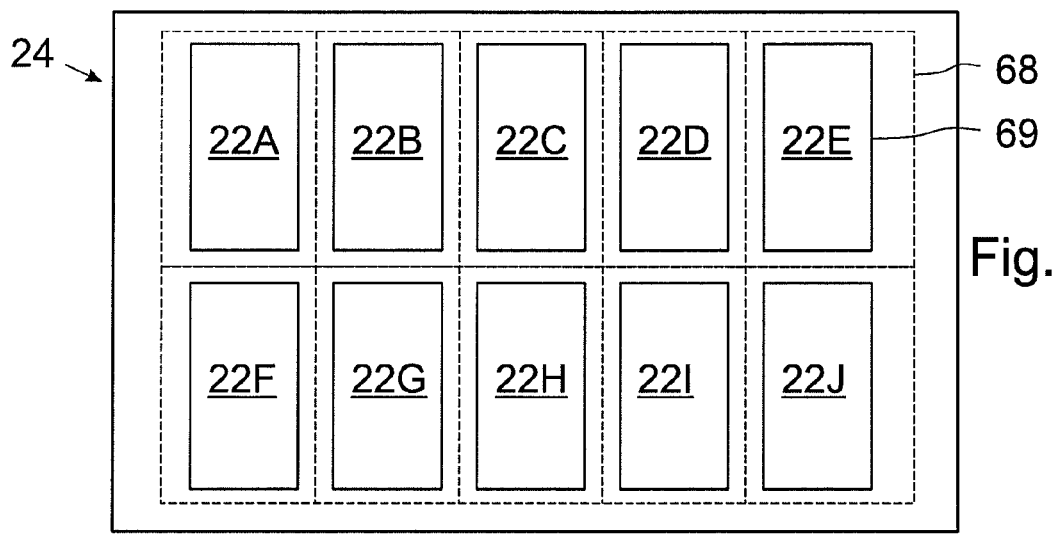
Fig. 6A
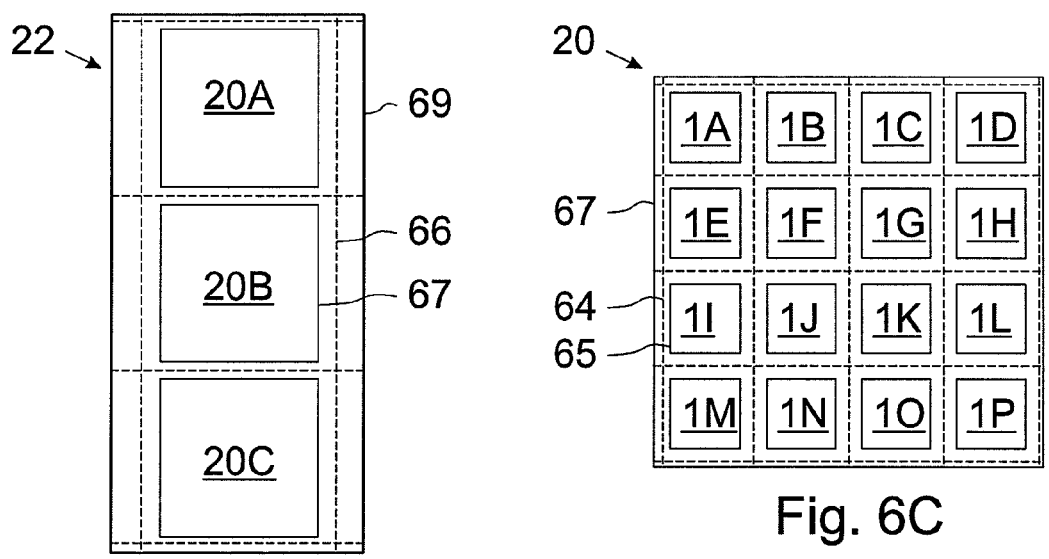
Fig. 6B
Fig. 6C
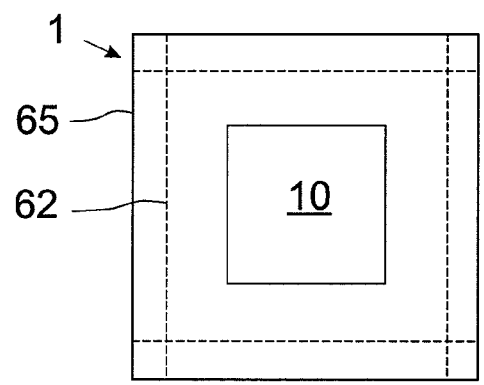
Fig. 6D

1.

2.

3.

4.

METHOD FOR CONTROLLING WARPAGE WITHIN ELECTRONIC PRODUCTS AND AN ELECTRONIC PRODUCT

TECHNICAL FIELD

The present invention relates to a method for controlling warpage within electronic products. Also there are disclosed electronic products manufactured by the presented method.

In particular, the present invention relates to a method for controlling warpage of electronic modules and printed circuit boards that comprise at least two insulating layers, at least one conductor pattern layer and at least one component at least partly embedded in an insulating layer. The component can be for example a semiconductor component, a microcircuit, a memory chip or a processor type of component. Substantially, the present method is suitable for electronic modules and printed circuit boards that have asymmetrical structure or large sized component in relation to the total size of a module, such as QFN (Quad Flat No Leads), BGA (Ball Grid Array) and SIP (System in Package) type of electronic modules.

BACKGROUND ART

Korean Patent Application publication KR 10-2009-0029582 teaches a method for forming open trenches to a solder mask layer on a surface of a printed circuit board.

U.S. Patent Application publication US 2010/0084748 teaches methods for minimizing warpage of a welded foil carrier structure used in the packaging of integrated circuits. The methods concentrate to solve warpage by affecting to the features of a metallic foil or manufacturing related them.

The main problem in the prior art is that warpage is still a major problem during the manufacturing process of the electronic circuit boards and especially, when manufacturing non-symmetrical circuit board structures with heat and pressure treatment.

SUMMARY OF THE INVENTION

The present invention describes a method for decreasing warpage of the electronic product. Also the invention handles the structure and the manufacturing process of the electronic product itself. The electronic product according to the invention comprises at least one wiring pattern layer, at least one insulating material layer, at least one embedded component connected to the wiring pattern layer, wherein at least one insulating material layer comprises groove holes for decreasing warpage of the electronic product.

In an embodiment of the invention, the insulating material layer is an uncured, a semi-cured or a cured substrate.

In an embodiment of the invention, the insulating material layer comprises reinforced glass fibers.

In an embodiment of the invention, the electronic product further comprises cured epoxy adhesive filling the groove holes after heat and pressure treatment.

In an embodiment of the invention, the electronic product further comprises a first uncured or semi-cured epoxy layer placed on top of the wiring pattern layer; a first cured epoxy layer placed on top of the first uncured or semi-cured epoxy layer; a second uncured or semi-cured epoxy layer with the groove holes placed on top of the first cured epoxy layer; and a second cured epoxy layer with the groove holes placed on top of the second uncured or semi-cured epoxy layer.

In an embodiment of the invention, the second cured epoxy layer is manufactured without the groove holes.

In an embodiment of the invention, the first cured epoxy layer comprises the groove holes.

In an embodiment of the invention, a second wiring pattern layer is placed on top of the second uncured or semi-cured epoxy layer instead of the second cured epoxy layer.

In an embodiment of the invention, a first uncured or semi-cured epoxy layer is placed on top of a first wiring pattern layer; a first cured epoxy layer is placed on top of the first uncured or semi-cured epoxy layer; a second uncured or semi-cured epoxy layer with the groove holes is placed on top of the first cured epoxy layer; a second cured epoxy layer is placed on top of the second uncured or semi-cured epoxy layer; an air gap on top of the second cured epoxy layer; a third cured epoxy layer is placed on top of the air gap; a third uncured or semi-cured epoxy layer with the groove holes is placed on top of the third cured epoxy layer; a fourth cured epoxy layer is placed on top of the third uncured or semi-cured epoxy layer; a fourth uncured or semi-cured epoxy layer is placed on top of the fourth cured epoxy layer; and a second wiring pattern layer is placed on top of the fourth uncured or semi-cured epoxy layer.

In an embodiment of the invention, a first uncured or semi-cured epoxy layer is placed on top of a first wiring pattern layer; a first cured epoxy layer is placed on top of the first uncured or semi-cured epoxy layer; a second uncured or semi-cured epoxy layer with the groove holes is placed on top of the first cured epoxy layer; a temporary bonding means on top of the second uncured or semi-cured epoxy layer; a third uncured or semi-cured epoxy layer with the groove holes is placed on top of the temporary bonding means; a second cured epoxy layer is placed on top of the third uncured or semi-cured epoxy layer; a fourth uncured or semi-cured epoxy layer is placed on top of the second cured epoxy layer; and a second wiring pattern layer is placed on top of the fourth uncured or semi-cured epoxy layer.

In an embodiment of the invention, the embedded component is placed in an installation cavity of the first uncured or semi-cured epoxy layer, the first cured epoxy layer and the second uncured or semi-cured epoxy layer.

In an embodiment of the invention, the groove holes are shaped as longitudinal ellipses, transversal ellipses, circles, crosses, rotated crosses, lines, triangles, squares, polygons or as a combination of at least two of the shapes.

In an embodiment of the invention, at least one second embedded component is electrically connected to a second wiring pattern layer.

In an embodiment of the invention, at least one groove hole is between the first wiring pattern layer and the second wiring pattern layer.

In an embodiment of the invention, the groove holes locate outside strips and/or between strips of a panel and/or between blocks of a strip and/or between modules of a block and/or between embedded components of a module.

In an embodiment of the invention, the width of the groove holes is between 50 and 300 micrometers.

In an embodiment of the invention, the thickness of the insulating material layers is between 40 and 240 micrometers.

In an embodiment of the invention, the at least one embedded component is a semiconductor component, a microcircuit, a memory chip or a processor.

In an embodiment of the invention, the electronic product is an intermediate product such as a panel, a strip, a block or a module.

According to another aspect of the present invention, the inventive idea comprises a corresponding method of manufacturing an electronic product with decreased warpage. The method comprises manufacturing at least one wiring pattern layer; manufacturing at least one insulating material layer; forming groove holes to at least one insulating material layer; connecting at least one embedded component to the wiring pattern layer; stacking the above layers on top of each other; and curing the stacked layers together with heat and pressure treatment in order to achieve the electronic product with decreased warpage.

In an embodiment of the invention, the method comprises forming the groove holes by laser drilling means.

In an embodiment of the invention, the method comprises forming the groove holes by mechanical means, cutting means, boring means, chemical reacting means or etching means.

In an embodiment of the invention, the method comprises placing the embedded component in an installation cavity formed in at least one insulating material layer.

In an embodiment of the invention, the groove holes are shaped as longitudinal ellipses, transversal ellipses, circles, crosses, rotated crosses, lines, triangles, squares, polygons or as a combination of at least two of the shapes.

In an embodiment of the invention, the method comprises forming the groove holes outside strips and/or between strips of a panel and/or between blocks of a strip and/or between modules of a block and/or between embedded components of a module.

In an embodiment of the invention, the width of the groove holes is between 50 and 300 micrometers.

In an embodiment of the invention, the thickness of the insulating material layers is between 40 and 240 micrometers.

An advantage to the present invention is that with the presented method and structure of the electronic product, warpage can be very effectively minimized when manufacturing printed circuit boards with heat and pressure treatment with symmetrical or asymmetrical structures, and especially warpage can be minimized when the printed circuit board is in use, as separated from the structure used during the manufacturing process.

Furthermore, neither of the prior art publications reveals a method or structure for controlling warpage of an electronic product by manufacturing groove holes to an insulating material layer or to several insulating material layers.

BRIEF DESCRIPTION OF THE DRAWINGS

FIG. 6A presents a top view of a panel including grooves according to an embodiment of the invention.

FIG. 6B presents a top view of a strip including grooves according to an embodiment of the invention.

FIG. 6C presents a top view of a block including grooves according to an embodiment of the invention.

FIG. 6D presents a top view of a module including grooves according to an embodiment of the invention.

DETAILED DESCRIPTION OF THE INVENTION

For a more complete understanding of the present invention and the advantages thereof, the invention is now described with the aid of the following examples and with reference to the accompanying drawings.

The present invention discloses structures of an electronic product and the corresponding manufacturing methods in order to minimize warpage when the electronic product is in actual use.

The general inventive concept comprises at least one wiring pattern layer; at least one insulating material layer; at least one embedded component connected to the wiring pattern layer, wherein at least one insulating material layer comprises groove holes for decreasing warpage of the electronic product.

Because the insulating layers form a notable part of an electronic circuit structure, at first the types of the insulating layers are discussed.

An insulation material layer consists of, for example, fiber mats impregnated with polymer, or membranes containing pre-hardened polymer and reinforced with fiber material. The polymer can be, for example, epoxy and the fiber reinforcement can be, for example, glass-fiber mat. A typical example of a suitable material for the insulation material layer is a FR4- or FR5-type, glass-fiber-reinforced epoxy membrane. Of course, other reinforcement and polymer-material combinations can be used. Instead of epoxy, the resin can be other material such as BT (bismale imide triazine), cyanate-ester based resin or polytetrafluoroethylene (Teflon®), for example. Other suitable materials for insulation material layer are PI (polyimide), aramid and ABF (Ajinomoto Build-up Film). Instead of, or as well as thermosetting plastics, it is also possible to utilize thermoplastics, for example some suitable LCP (liquid crystal polymer) material in the insulation material layer. When using several insulation material layers, it is also possible for the layers to differ from each other.

Figure 1A:
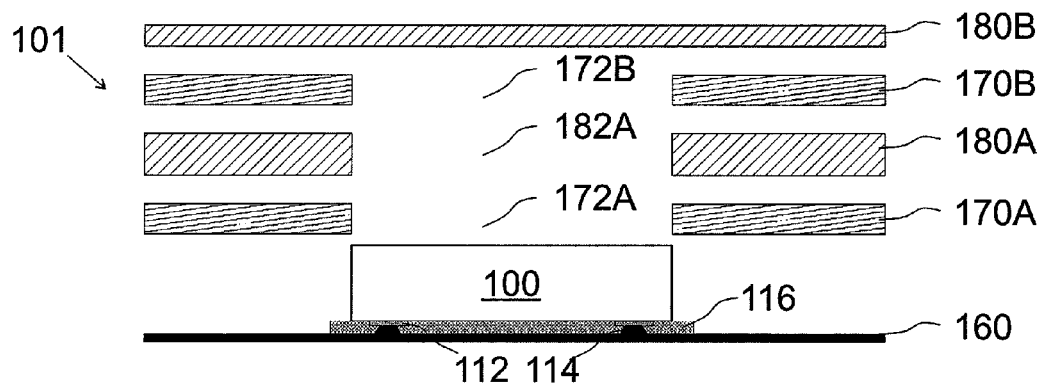
FIG. 1A presents a schematic cross profile of an electronic module according to prior art.

FIG. 1A presents a schematic cross profile of an electronic module 101 according to the prior art. The electronic module 101 comprises of a semiconductor component 100 which is faced with its contact pads 112 towards a conductive pattern layer 160. An adhesive layer 116 attaches the semiconductor component 100 to the conductive pattern layer 160. The semiconductor component 100 is coupled to the conductive pattern layer 160 by means of microvias 114 that are in straight contact with the contact pads 112 of the semiconductor component 100. In this prior art example the electronic module 101 comprises of four different substrate layers that are stacked on each other. The layers are in the following order: A first uncured or semi-cured substrate layer of fiberglass reinforced epoxy layer 170A having an installation cavity 172A for the semiconductor component 100; a first cured substrate layer of fiberglass reinforced epoxy layer 180A having an installation cavity 182A for the semiconductor component 100; a second uncured or semi-cured substrate layer of fiberglass reinforced epoxy layer 170B having an installation cavity 172B for the semiconductor component 100. Finally, on top of the second uncured or semi-cured substrate layer of fiberglass reinforced epoxy layer 170B the second cured substrate layer of fiberglass reinforced epoxy layer 180B is stacked. Epoxy layers 170A-B may be a prepreg, that is, a B-stage epoxy resin material. Furthermore, epoxy layers 180A-B may be laminate, that is, a C-stage epoxy resin material.

Figure 1B:
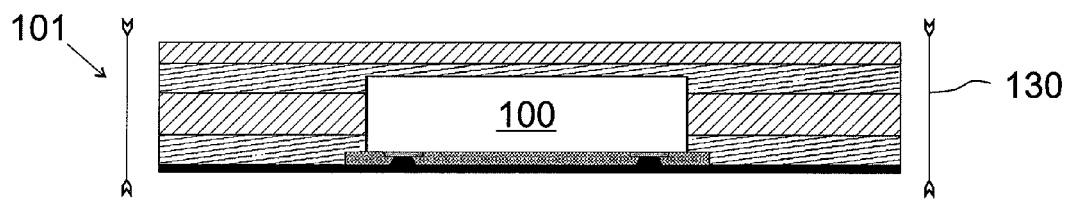
FIG. 1B presents a schematic cross profile of an electronic module before the manufacturing phase of conducting heat and pressure to the electronic module according to prior art.

FIG. 1B presents a schematic cross profile of stacked substrate layers 130 of the electronic module 101 before the manufacturing phase of conducting heat and pressure 132 to the electronic module according to prior art.

Figure 1C:
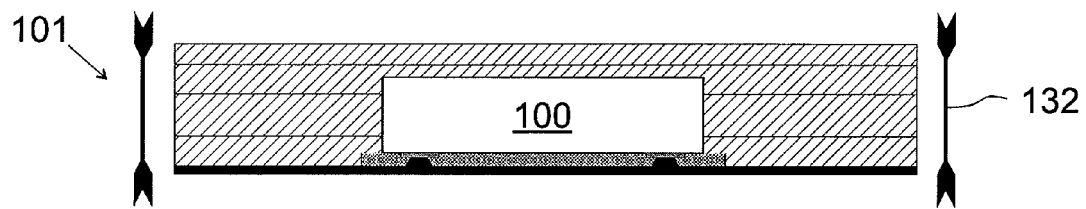
FIG. 1C presents a schematic cross profile of an electronic module just after the manufacturing phase of conducting heat and pressure to the electronic module according to prior art.

FIG. 1C presents a schematic cross profile of an electronic module 101 after the manufacturing phase of conducting heat and pressure 132 to the electronic module 101 according to prior art. After the heat and pressure treatment 132 all the uncured or semi-cured substrate layers are transformed as cured substrate layers.

Figure 1D:
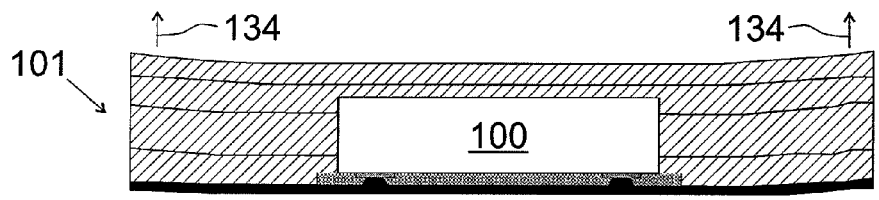
FIG. 1D presents a schematic cross profile of an electronic module having warpage according to prior art.

FIG. 1D presents a schematic cross profile of an electronic module 101 having warpage according to the prior art. Especially, warpage may appear in asymmetric designs wherein there is only one conductive pattern layer 160 or the semiconductor component 100 is not positioned in the center line of the electronic module 101 or used substrate layers comprise an unbalanced structure. The warpage 134 is a consequence of shrinkage and solidification of reinforced fibers when uncured or semi-cured substrate layers 170 transform after the heat and pressure treatment 132 into cured substrate layers 180.

Figure 2A:
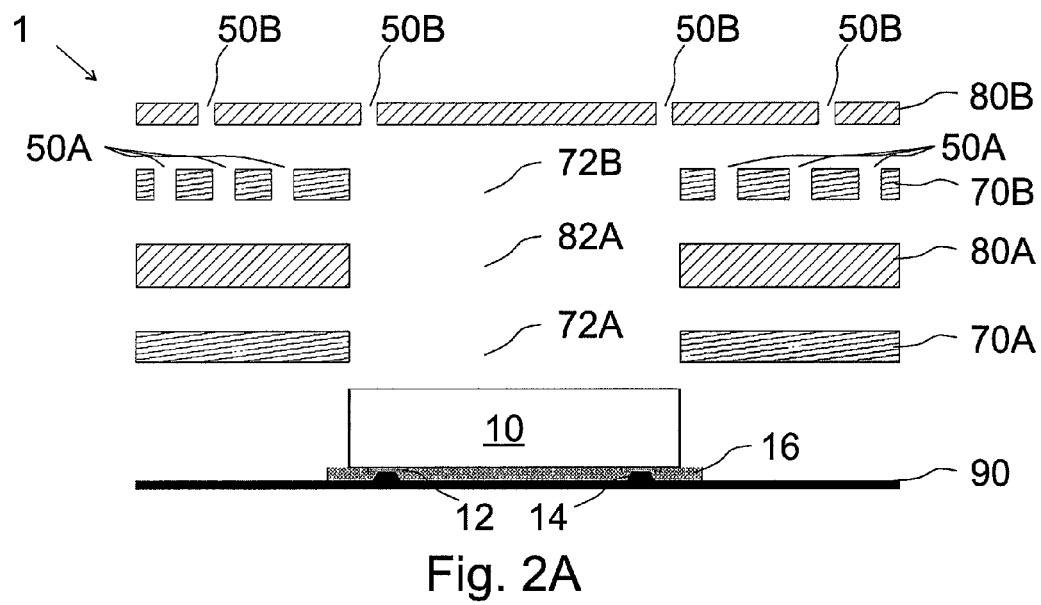
FIG. 2A presents a schematic cross profile of an electronic module according to a first embodiment of the invention.

FIG. 2A presents a schematic cross profile of an electronic module 1 according to a first embodiment of the invention. The electronic module 1 comprises of a conductive pattern (or wiring) layer 90 on top a semiconductor component 10 which is faced with its contact pads 12 towards the conductive pattern layer 90. The semiconductor component 10 is attached to the conductive pattern layer 90 by means of an adhesive layer 16 that can be locally placed only between the component 10 and the conductive pattern layer 90. As a second alternative solution, there can be additionally a second adhesive layer 18 running globally on top of the conductive pattern layer 90. The local (first) adhesive layer 16 will then be placed between the component 10 and the global (second) adhesive layer 18. As a third alternative solution, there can be only the second adhesive layer 18 running globally between the conductive pattern layer 90 and the component 10. The semiconductor component 10 is coupled to the conductive pattern layer 90 by means of microvias 14 that are in straight contact with the contact pads 12 of the semiconductor component 10. According to the first embodiment of the invention the electronic module 1 comprises of four different substrate layers that are stacked on top of each other. The layers are in the following order: A first uncured or semi-cured substrate layer of fiberglass reinforced epoxy layer 70A (a prepreg or a B-stage epoxy resin) having an installation cavity 72A for the semiconductor component 10; a first cured substrate layer of fiberglass reinforced epoxy layer 80A having an installation cavity 82A for the semiconductor component 10; a second uncured or semi-cured substrate layer of fiberglass reinforced epoxy layer 70B (a prepreg or a B-stage epoxy resin) having an installation cavity 72B for the semiconductor component 100 and groove holes 50A for decreasing warpage in the electronic module 1; a second cured substrate layer of fiberglass reinforced epoxy layer 80B having groove holes 50B for decreasing warpage in the electronic module 1. Layers 80A and 80B are thus a first and second cured substrate layers of fiberglass reinforced epoxy, correspondingly, and they can be laminate or C-stage epoxy resin. Additionally, groove holes 50A are therefore formed to the uncured or semi-cured substrate which can be a prepreg or a B-stage epoxy resin material. However, groove holes 50B are formed to the cured substrate which can be a laminate or a C-stage epoxy resin material.

Figure 2B:
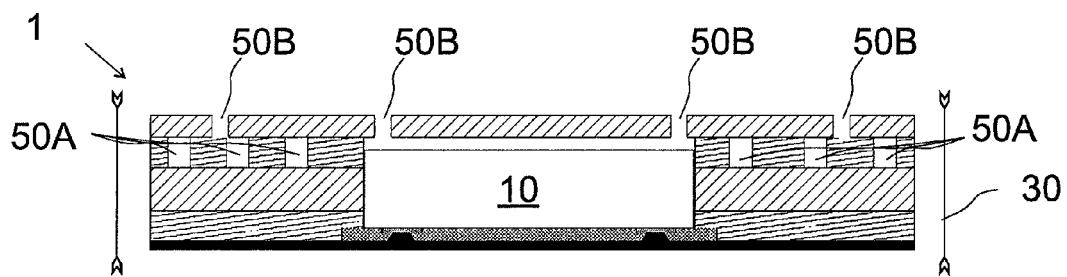
FIG. 2B presents a schematic cross profile of an electronic module before the manufacturing phase of conducting heat and pressure to the electronic module according to the first embodiment of the invention.

FIG. 2B presents a schematic cross profile of a stacked substrate layer 30 of the electronic module 1 before the manufacturing phase of conducting heat and pressure 32 to the electronic module 1 according to the first embodiment of the invention. The stacked substrate layer 30 starts from the conductive pattern layer 90 wherein the first uncured or semi-cured substrate layer of fiberglass reinforced epoxy layer 70A is stacked on the top of the conductive pattern layer 90. The first uncured or semi-cured substrate layer of fiberglass reinforced epoxy layer 70A contains an installation cavity 72A for the semiconductor component 10. On top of the first uncured or semi-cured substrate layer of fiberglass reinforced epoxy layer 70A, the first cured substrate layer of fiberglass reinforced epoxy layer 80A is stacked. The first cured substrate layer of fiberglass reinforced epoxy layer 80A contains respectively an installation cavity 82A for the semiconductor component 10. On top of the first cured substrate layer of fiberglass reinforced epoxy layer 80A, the second uncured or semi-cured substrate layer of fiberglass reinforced epoxy layer 70B is stacked. The second uncured or semi-cured substrate layer of fiberglass reinforced epoxy layer 70B contains respectively an installation cavity 72B for the semiconductor component and groove holes 50A for decreasing warpage in the electronic module 1. Finally, on top of the second uncured or semi-cured substrate layer of fiberglass reinforced epoxy layer 70B, the second cured substrate layer of fiberglass reinforced epoxy layer 80B is stacked. The second cured substrate layer of fiberglass reinforced epoxy layer 80B has groove holes 50B for decreasing warpage in the electronic module 1.

Figure 2C:
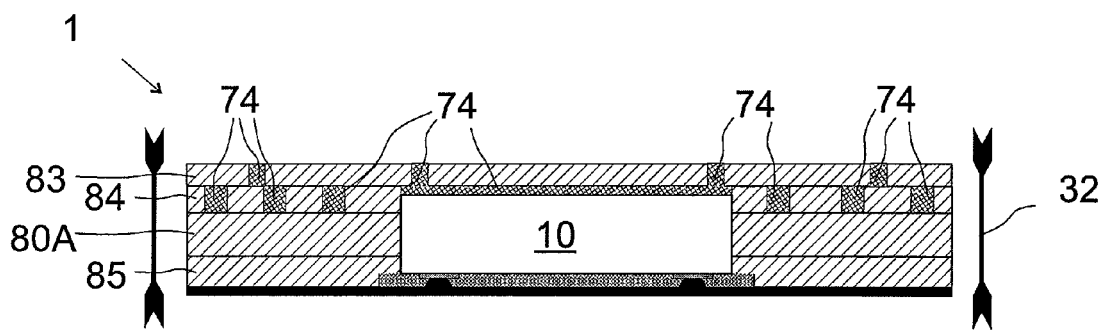
FIG. 2C presents a schematic cross profile of an electronic module after the manufacturing phase of conducting heat and pressure to the electronic module according to the first embodiment of the invention.

FIG. 2C presents a schematic cross profile of an electronic module 1 after the manufacturing phase of conducting heat and pressure 32 to the electronic module 1 according to the first embodiment of the invention. After the heat and pressure treatment 32 all uncured or semi-cured substrate layers are transformed as cured substrate layers. Especially, in asymmetric electronic module designs, warpage may appear. Asymmetric designs such as the first embodiment of the invention, for example, may contain only one conductive pattern layer 90 or the semiconductor component 10 is not positioned in the center line of the electronic module 1 or used substrate layers comprise an unbalanced structure. The warpage of an electronic module is mainly a consequence of shrinkage and solidification of reinforced fibers when uncured or semi-cured substrate layers 70 transform after the heat and pressure treatment 32 into cured substrate layers 80. Moreover, within electronic modules comprising of several substrate layers the amount of warpage changes between the different types of substrate layers (uncured, semi-cured, cured) and different thicknesses of substrate layers. The warpage is also caused by the different shrinkage factor of an uncured or semi-cured substrate material which is greater than totally cured substrate material has. When heat and pressure are conducted to an uncured or semi-cured substrate layer the fibers that reinforce the whole structure of the substrate layer are re-aligned and re-ordered to an occasional form before the epoxy dries. By using groove holes 50 within a substrate layer or within several substrate layers the consequence of substrate layer shrinkage and bending can be minimized or even totally avoided according to an embodiment of the invention. The groove holes 50 cut the longitudinal forces caused by reinforcing fibers both in uncured or semi-cured substrates and in cured substrates. During the heat and pressure treatment 32 uncured or semi-cured epoxy adhesive 74 inside uncured or semi-cured substrate layers flows to the all open groove holes 50A and 50B by filling them wholly. This is explained in more detail in the embodiments referring to FIGS. 6 and 7. As mentioned earlier, the uncured or semi-cured substrate layers 70A and 70B transform to cured substrate layers 85 and 84, respectively. Likewise, the cured substrate layer 80B having groove holes 50B filled wholly with cured epoxy adhesive 74 transforms to a cured (also originally cured) substrate layer 83 including groove holes filled with pure cured epoxy resin 74 after the heat and pressure treatment. Additionally, in other words, a cured substrate layer 85 (which is originally uncured or semi-cured) of fiberglass reinforced epoxy, is formed after the heat and pressure treatment.

Figure 3A:
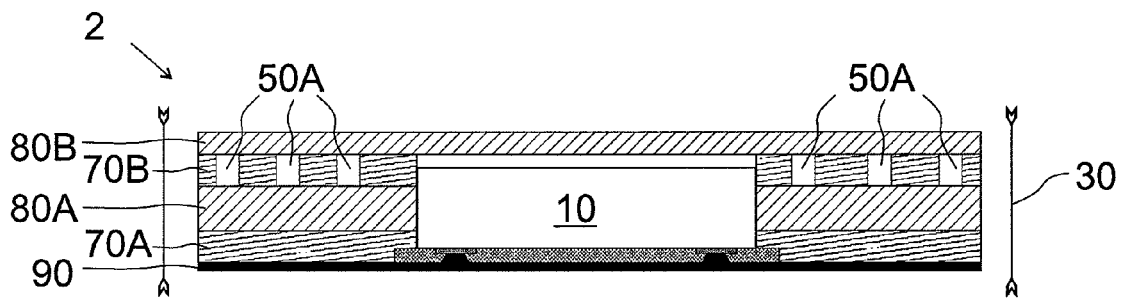
FIG. 3A presents a schematic cross profile of an electronic module according to a second embodiment of the invention.

FIG. 3A presents a schematic cross profile of an electronic module 2 according to a second embodiment of the invention. The second embodiment of the invention differs from the first embodiment that only the second uncured or semi-cured substrate layer 70B contains groove holes 50A for controlling warpage.

Figure 3B:
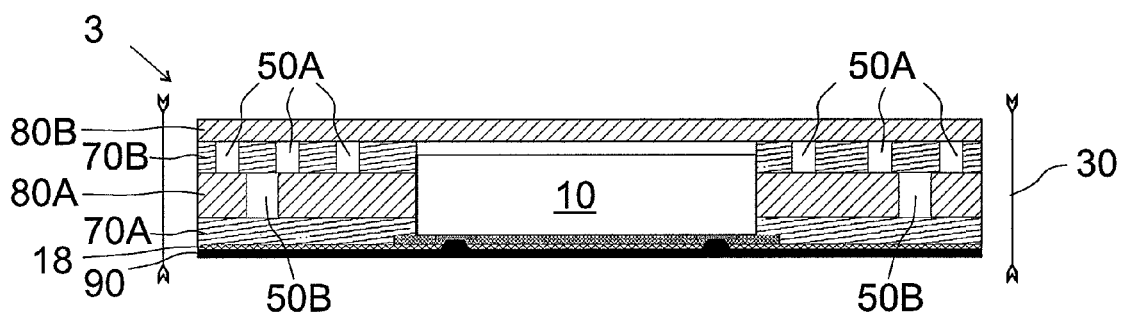
FIG. 3B presents a schematic cross profile of an electronic module according to a third embodiment of the invention.

FIG. 3B presents a schematic cross profile of an electronic module 3 according to a third embodiment of the invention. The third embodiment of the invention differs from the first embodiment that despite the second cured substrate layer 80B, the first cured substrate layer 80A contains groove holes 50B for controlling warpage. Also there is presented a second adhesive layer 18 running globally on top of the conductive pattern layer 90.

Figure 3C:
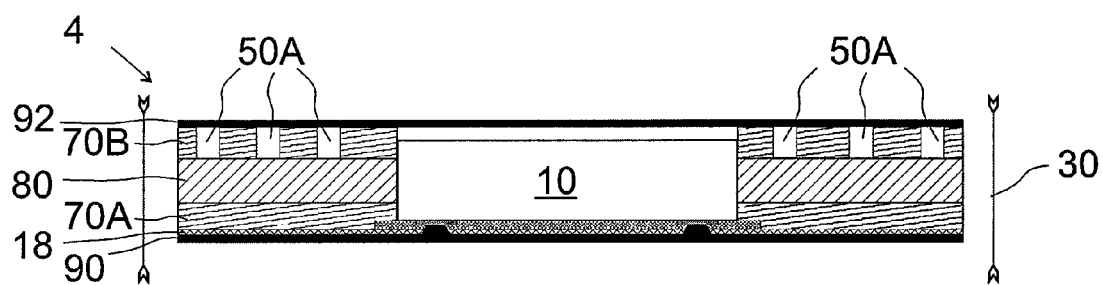
FIG. 3C presents a schematic cross profile of an electronic module according to a fourth embodiment of the invention.

FIG. 3C presents a schematic cross profile of an electronic module 4 according to a fourth embodiment of the invention. The fourth embodiment of the invention differs from the first embodiment that only the second uncured or semi-cured substrate layer 70B contains groove holes 50A. Also the second cured substrate layer 80B is missing but instead of it, the second conductive pattern (or wiring) layer 92 exists in the fourth embodiment of the invention. Furthermore, there is presented a second adhesive layer 18 running globally on top of the conductive pattern layer 90.

Figure 4A:
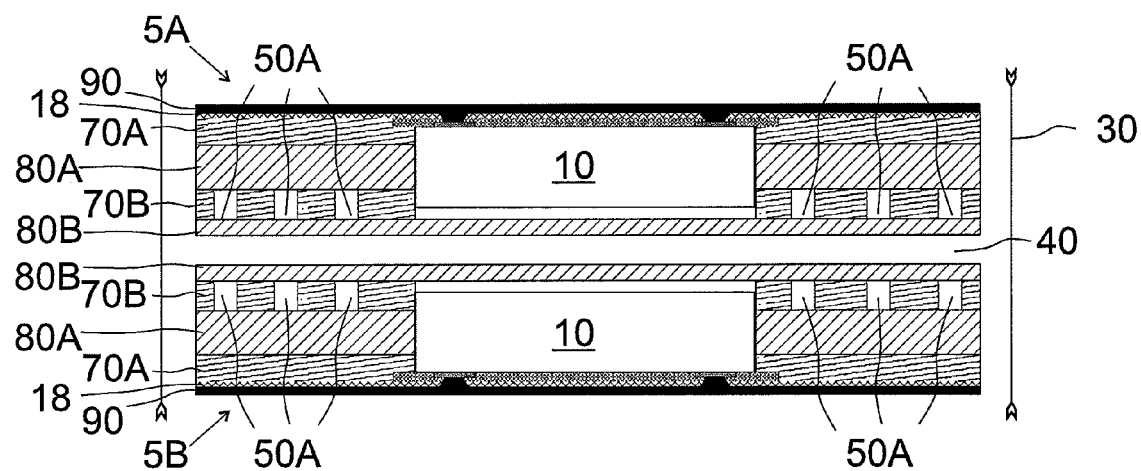
FIG. 4A presents a schematic cross profile of an electronic module according to a fifth embodiment of the invention.

FIG. 4A presents a schematic cross profile of electronic modules 5A and 5B according to a fifth embodiment of the invention. In the fifth embodiment there is presented an intermediate phase of double-up manufacture of asymmetric electronic modules 5A and 5B. The electronic modules 5A and 5B are manufactured as a symmetric structure when conducting heat and pressure to the whole stack structure 30. The back side substrates 80B being cured substrate layers have weak adhesion or even no adhesion between each other. Therefore an air gap 40 may be left between the cured substrate layers 80B. The electronic modules 5A and 5B contain the groove holes 50A for controlling warpage.

Figure 4B:
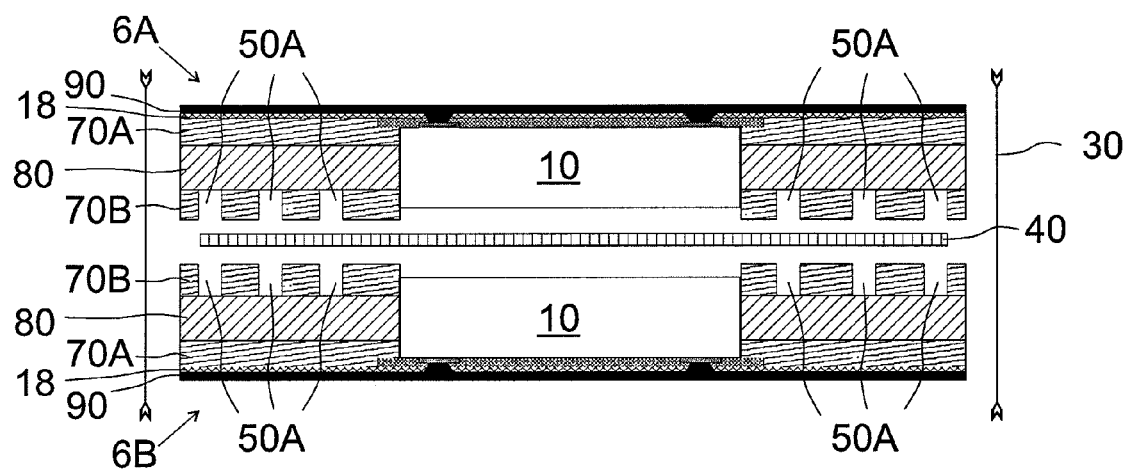
FIG. 4B presents a schematic cross profile of an electronic module according to a sixth embodiment of the invention.

FIG. 4B presents a schematic cross profile of electronic modules 6A and 6B according to a sixth embodiment of the invention. In the sixth embodiment there is presented another intermediate phase of double-up manufacture of asymmetric electronic modules 6A and 6B. The electronic modules 6A and 6B are manufactured as a symmetric structure when conducting heat and pressure to the whole stack structure 30. The back side substrates 70B being uncured or semi-cured substrate layers have strong adhesion between each other. Therefore, a temporary bonding means 40 can be used between the uncured or semi-cured substrate layers 70B of electronic modules 6A and 6B. The electronic modules 6A and 6B contain the groove holes 50A for controlling warpage.

Figure 5A:
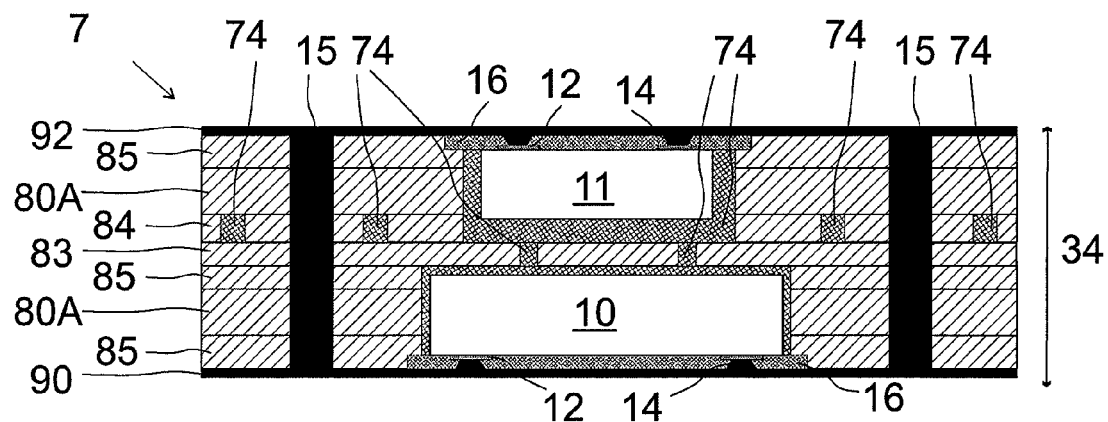
FIG. 5A presents a schematic cross profile of an electronic module according to a seventh embodiment of the invention.

FIG. 5A presents a schematic cross profile of an electronic module 7 according to a seventh embodiment of the invention. In the seventh embodiment there is presented an intermediate phase of an asymmetric 3D electronic module after the manufacturing phase of conducting heat and pressure to the whole stack structure 34. The asymmetric 3D electronic module 7 contains at least two embedded components 10, 11 that have different size. Components 10 and 11 may be passive, active or semiconductor components. Furthermore, the two embedded components 10, 11 are connected to the first 90 and second 92 wiring layers respectively. Contact pads 12, microvias 14 and adhesive layers 16 are provided in a similar manner as in FIG. 2A. Due to difference in sizes of the embedded components 10, 11 warpage may appear in the electronic module 7. The groove holes for controlling warpage in the insulating layers 83, 84 as well as the surroundings of the embedded components 10, 11 are filled with epoxy adhesive 74 when heat and pressure was conducted to the electronic module 7. In other words, the cured substrate layer 84 (which is originally uncured or semi-cured) of fiberglass reinforced epoxy includes groove holes filled with pure cured epoxy resin 74 after heat and pressure treatment. In the electronic module 7, there are also plated through holes 15 for connecting the first 90 and the second 92 wiring layers together. Warpage can be controlled by the size or amount of groove holes, by placing the groove holes in several different insulating material layers (80A, 83, 84, 85) or using different thicknesses of the insulating material layers (80A, 83, 84, 85).

Figure 5B:
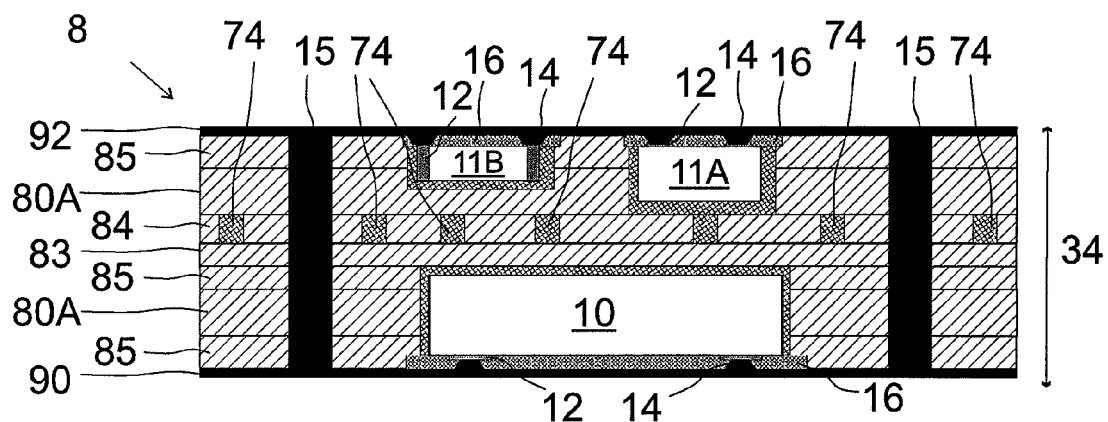
FIG. 5B presents a schematic cross profile of an electronic module according to an eighth embodiment of the invention.

FIG. 5B presents a schematic cross profile of an electronic module 8 according to an eighth embodiment of the invention. In the eighth embodiment there is presented an intermediate phase of another asymmetric 3D electronic module after the manufacturing phase of conducting heat and pressure to the whole stack structure 34. The asymmetric 3D electronic module 8 contains three embedded components that all have different size. A semiconductor component 10 is electrically connected to the first wiring layer 90. There is another semiconductor component 11A that is electrically connected to the second wiring layer 92. Also a discrete component 11B (e.g. a decoupling capacitor) is electrically connected to the second wiring layer 92. Contact pads 12, microvias 14 and adhesive layers 16 are provided in a similar manner as in FIG. 5A. Due to difference in sizes of the embedded components 10, 11A, 11B warpage may appear in the electronic module 8. The groove holes for controlling warpage in the insulating layer 84 as well as the surroundings of the embedded components 10, 11A, 11B are filled with epoxy adhesive 74 when heat and pressure was conducted to the electronic module 8. In the electronic module 8 there are also plated through holes 15 for connecting the first 90 and the second 92 wiring layers together. Warpage can be controlled by the size or amount of groove holes, by placing the groove holes in several different insulating material layers (80A, 83, 84, 85) or using different thicknesses of the insulating material layers (80A, 83, 84, 85). As in FIG. 5A, components 10, 11A and 11B may be passive, active or semiconductor components.

As previously presented, the embodiments of the invention have been concentrated on controlling warpage within an electronic module. Warpage as a phenomenon occurs also in larger level than within an individual electronic module. Furthermore, warpage can be detected especially after the heat and pressure treatment within a manufacturing process of electronic modules. At this intermediate phase of manufacture, electronic products can be for example in blocks, strips or panels of which each contains ten, hundreds or even thousands of electronics modules.

FIG. 6A presents a top view of a panel 24 including groove holes 68 for controlling warpage according to an embodiment of the invention. The panel 24 comprises of ten separate strips 22A to 22J, for example. Panel level warpage occurs for example as a gentle bend on the whole way of a panel 24. There can be also other types of panel level warpage. Panel level warpage may occur especially when there are lots of different types of embedded components within a panel or the population of used embedded components of a panel is on a high level. For controlling the panel level warpage the groove holes 68 can be located outside the strips 22A-22J like in the FIG. 6A or they may also be inside the strips 22A-22J according to an embodiment of the invention. In a preferred embodiment of the invention, the groove holes 68 can be just in the dicing line 69 of strips. Likewise as previously presented in the embodiments of FIGS. 2 to 5, the groove holes 68 can be located only in one substrate layer or in several substrate layers of a panel 24 for controlling panel level warpage. After the panel 24 is ready, the strips 22A-22J are separated apart from the panel at the location of the dicing line 69 by means of a dicing saw or laser, for example. Panel size may vary a lot; a typical panel size can be 454×549 millimeters, for instance.

FIG. 6B presents a top view of a strip 22 including groove holes 66 for controlling warpage according to an embodiment of the invention. The strip 22 comprises of three separate blocks 20A to 20C, for example. Strip level warpage occurs similarly like panel level warpage as gentle bending on the whole way of the strip 22. There can also be other types of strip level warpage. Strip level warpage may occur especially when there are lots of different types of embedded components within a strip or the population of used embedded components of a strip is on a high level. For controlling the strip level warpage, the groove holes 66 can be located outside the blocks 20A-20C like in the FIG. 6B or they may also be inside the blocks 20A-20C according to an embodiment of the invention. In a preferred embodiment of the invention, the groove holes 66 can be just in the dicing line 67 of the blocks. Likewise as previously presented in the embodiments of FIGS. 2 to 4, the groove holes 66 can be located only in one substrate layer or in several substrate layers of a strip 22 for controlling panel level warpage. Blocks 20A-20C are separated apart from the strip at the location of the dicing line 67 by means of a dicing saw or laser, for example. Strip size may vary a lot; a typical strip size can be 240×74 millimeters, for instance.

FIG. 6C presents a top view of a block 20 including groove holes 64 for controlling warpage according to an embodiment of the invention. The block 20 comprises of sixteen separate modules 1A to 1P, for example. Block level warpage occurs similarly like panel or strip level warpage as gentle bending on the whole way of a block 20. There can also be other types of block level warpage. Block level warpage may occur especially when there are lots of different types of embedded components within a block or the population of used embedded components of a block is on a high level. For controlling the block level warpage, the groove holes 64 can be located outside the modules 1A to 1P like in the FIG. 6C or they may also be inside the modules 1A to 1P according to an embodiment of the invention. In a preferred embodiment of the invention, the groove holes 64 can be just in the dicing line 65 of the modules. Likewise as previously presented in the embodiments of FIGS. 2 to 5, the groove holes 64 can be located only in one substrate layer or in several substrate layers of a block 20 for controlling panel level warpage. Modules 1A to 1P are separated apart from the block 20 at the location of the dicing line 65 by means of a dicing saw or laser, for example. Block size may vary a lot; a typical block size can be 75×67 millimeters, for instance.

FIG. 6D presents a top view of a module 1 including groove holes 62 for controlling warpage according to an embodiment of the invention. The module comprises at least one embedded semiconductor component 10. There can be several semiconductor components 10 within one module 1. Module level warpage occurs similarly like panel, strip or block level warpage as gentle bending on the whole way of the module 1. There can also be other types of module level warpage. Module level warpage may occur in asymmetric designs wherein there is only one conductive pattern layer or embedded semiconductor components are not positioned in the center line of the module 1 or embedded semiconductor components 10 are large sized compared to the whole module 1 or used substrate layers comprise an unbalanced structure. For controlling the module level warpage, the groove holes 62 can be located inside the module 1 according to an embodiment of the invention. In a preferred embodiment of the invention, the groove holes 62 can be just in the dicing line 65 of the modules. According to an embodiment of the invention in electronic modules, there may not appear any signs of groove holes 62. Yet according to an embodiment of the invention, there can be manufactured certain shaped groove holes 62 inside the electronic module 1 to ensure a lot, origin or manufacturer etc. of the electronic module 1. Likewise as previously presented in the embodiments of FIGS. 2 to 5, the groove holes 62 can be located only in one substrate layer or in several substrate layers of a module 1 for controlling warpage. Module size may vary a lot; a typical module size can be from 7×7 to 15×15 millimeters, for instance. As is obvious, electronic modules need not to be shaped as squares. As is obvious for a skilled person in the art, the dimensions of different types of electronic products or some intermediate products or phases can be avoided or not used. This can happen when no blocks are present in a strip, for example. And vice versa, the strips may contain the modules.

Figure 7A:
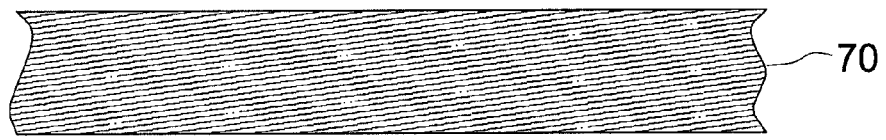
FIG. 7A presents a cross profile series of forming grooves to uncured insulation layer according to an embodiment of the invention.
Figure 7A:
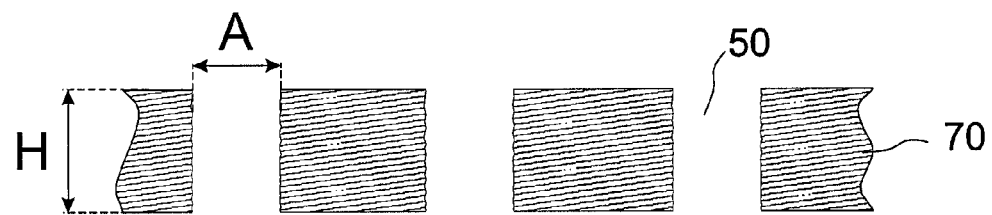
Figure 7A:
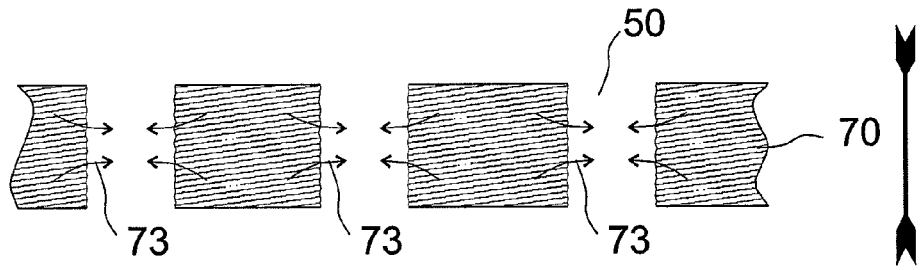
Figure 7A:
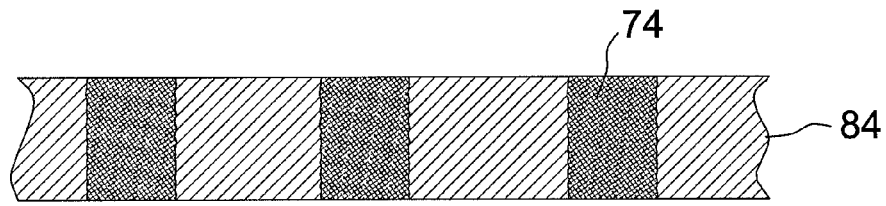

FIG. 7A presents a cross profile series of forming groove holes 50 to uncured or semi-cured insulation layer 70 according to an embodiment of the invention. In the first phase, a type and thickness of a substrate layer must be chosen. The types can be for example uncured, semi-cured and cured substrate layers. Typical thicknesses of the substrate layers are for example from 40 to 240 micrometers. As is obvious for a skilled person in the art, the thicknesses of the substrate layers can be thinner than 40 micrometers or thicker than 240 micrometers. In this example, an uncured or semi-cured substrate layer 70 having H as thickness is taken. The substrate layer 70 can be of any size but according to a preferred embodiment of the invention, the size is the same as a panel size or the largest size which is used in the manufacturing. The uncured or semi-cured substrate layer 70 of fiberglass reinforced epoxy can be a prepreg or a B-stage epoxy resin. In the second phase, the groove holes 50 are formed through the substrate layer. In a preferred embodiment of the invention, the groove holes are formed by laser drilling means. By means of laser drilling groove holes 50 with a width A can be easily chosen by a programmatic laser beam that can be between the measures of 50 and 300 micrometers, for instance. Naturally, as a person skilled in the art notices, the groove holes 50 may be broader than the given example as well as they may be manufactured also by some other means than a laser drill. At a third phase, when all the desired groove holes 50 are formed and all the substrate layers are stacked together, heat and pressure are conducted to the stacked layers. During the heat and pressure treatment, the hot uncured or semi-cured epoxy glue 73 flows everywhere which is free and especially into the groove holes 50. It should be noted that reinforced fiberglass does not flow into the groove holes 50. At a fourth phase, after the heat and pressure treatment, the reinforced fiberglass and epoxy glue are cured and they are now in final position. The groove holes 50 are totally filled with pure cured epoxy glue 74 and otherwise the substrate layer has become to a cured substrate layer 84.

Figure 7B:
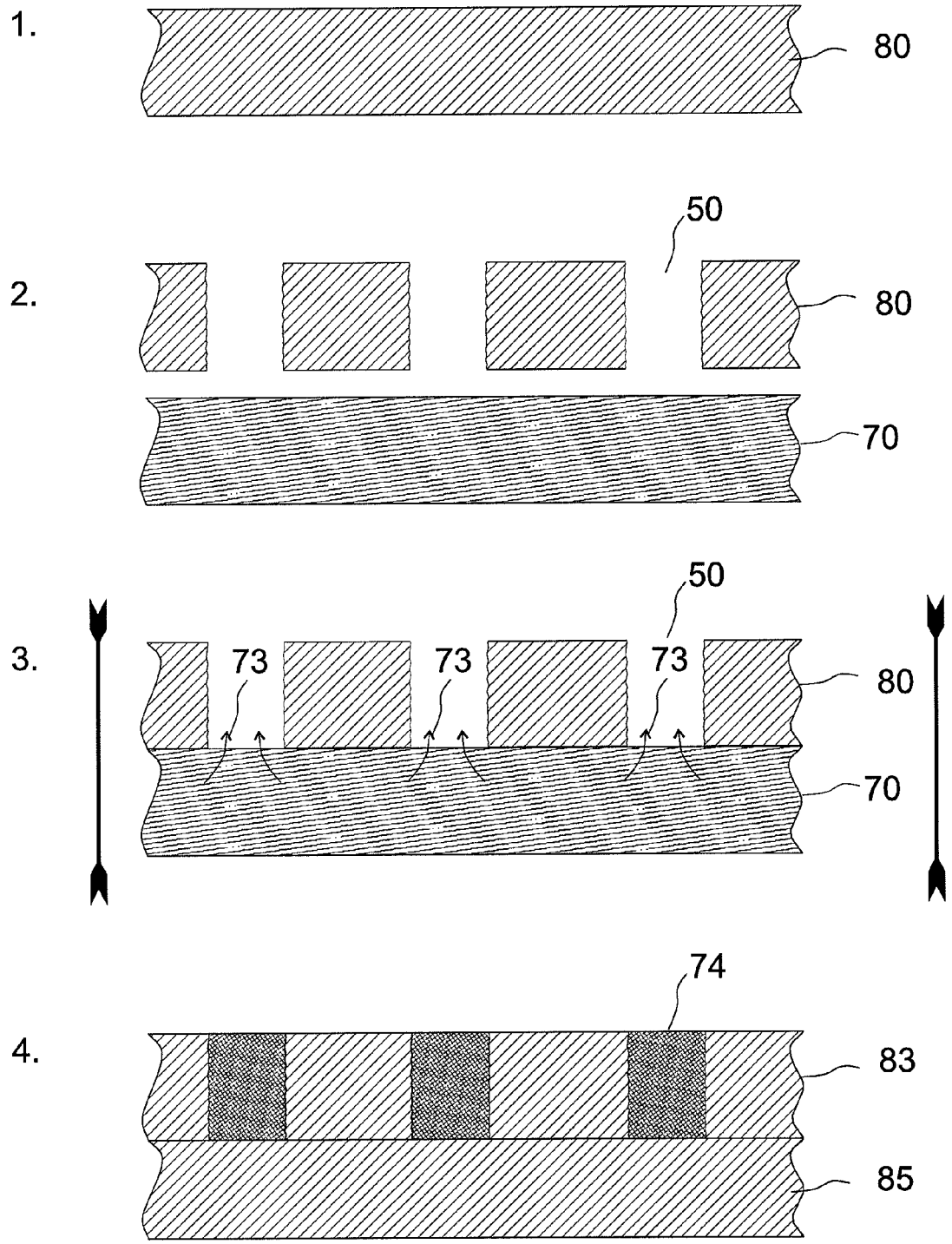
FIG. 7B presents a cross profile series of forming grooves to cured insulation layer according to an embodiment of the invention.

FIG. 7B presents a cross profile series of forming groove holes 50 to a cured insulation layer 80 according to an embodiment of the invention. In the first phase, a type and thickness of a substrate layer must be chosen. The types can be for example uncured, semi-cured and cured substrate layers. Typical thicknesses of the substrate layers are for example between 40 and 240 micrometers. As is obvious for a skilled person in the art, the thicknesses of the substrate layers can be thinner than 40 micrometers or thicker than 240 micrometers. In this example, a cured substrate layer 80 is taken. The substrate layer 80 can be of any size but according to a preferred embodiment of the invention, the size is the same as a panel size or the largest size which is used in the manufacturing. The cured substrate layer 80 of fiberglass reinforced epoxy can be a laminate or a C-stage epoxy resin. In the second phase, the groove holes 50 are formed through the substrate layer 80. In a preferred embodiment of the invention, the groove holes are formed by laser drilling means. By means of laser drilling groove holes 50 with a width A can be easily chosen by a programmatic laser beam that can be between the measures of and 300 micrometers, for instance, likewise in the example presented in FIG. 7A. Due to the nature of a cured substrate layer, it does not transform any more at all and it does not contain any flowing materials inside. Therefore, there is needed an uncured or semi-cured substrate layer 70 together with it. At the third phase, when all the desired groove holes 50 are formed and all the substrate layers are stacked together, heat and pressure is conducted to the stacked layers. During the heat and pressure treatment the uncured epoxy glue 73 from the uncured or semi-cured substrate layer 70 flows everywhere where is free and especially into the groove holes 50. It should be noted that reinforced fiberglass does not flow into the groove holes 50. At the fourth phase, after the heat and pressure treatment, the reinforced fiberglass and epoxy glue are cured and they are now in final position. The groove holes 50 of the finally cured substrate layer 83 are totally filled with cured epoxy glue 74. The stacked uncured or semi-cured substrate layer 70 has become to a cured substrate layer 85.

Figure 8A:
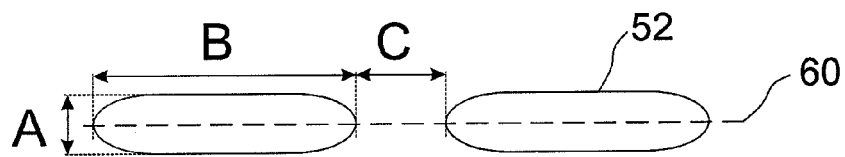
FIG. 8A presents a top view of a first type of a groove line according to an embodiment of the invention.

FIG. 8A presents a top view of a first type of a groove hole line according to an embodiment of the invention. The first type of a groove hole is a longitudinal ellipse 52. The groove hole line 60 splits the ellipses 52 in an axial direction. The groove holes can be made by varying the dimensions of the width of a groove hole (A), the length of the groove hole (B) and the gap between two groove holes (C).

Figures 8B, 8C:
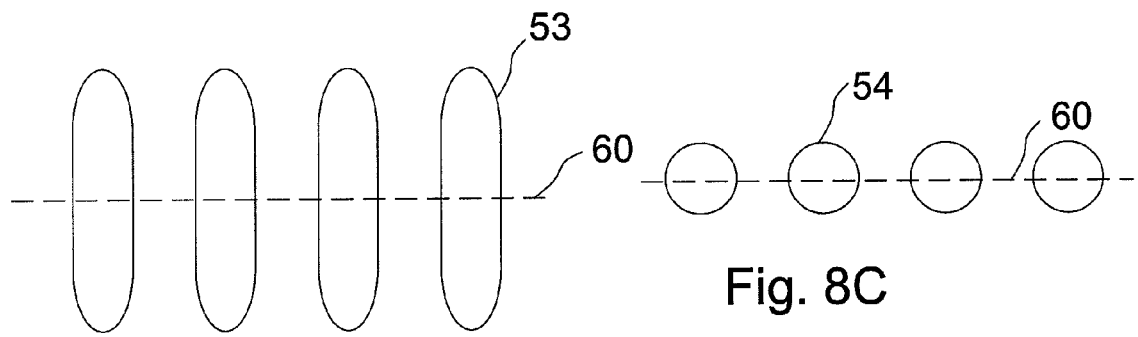
FIG. 8B presents a top view of a second type of a groove line according to an embodiment of the invention.
FIG. 8C presents a top view of a third type of a groove line according to an embodiment of the invention.

FIG. 8B presents a top view of a second type of a groove hole line according to an embodiment of the invention. The second type of a groove hole is a transversal ellipse 53. The groove hole line 60 splits the ellipses 53 in cross direction.

FIG. 8C presents a top view of a third type of a groove hole line according to an embodiment of the invention. The third type of a groove hole is a rounded hole or a circle 54. The groove hole line 60 splits the circles 54 in half.

Figure 8D:
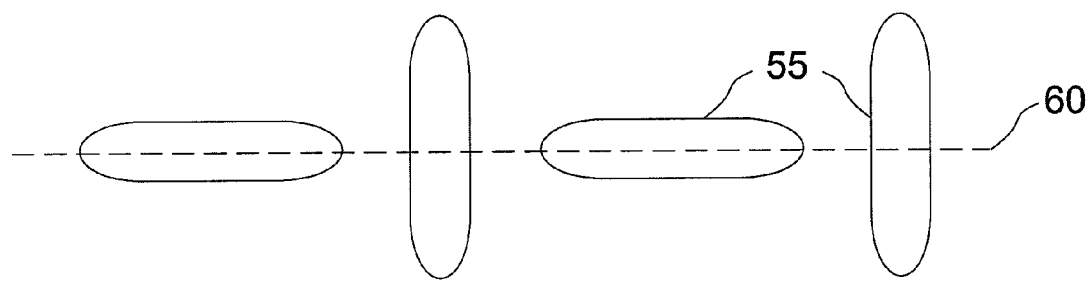
FIG. 8D presents a top view of a fourth type of a groove line according to an embodiment of the invention.

FIG. 8D presents a top view of a fourth type of a groove hole line according to an embodiment of the invention. The fourth type of a groove hole line is made by alternating pattern of groove holes 55. The groove hole line 60 splits the alternating figures of the groove holes 55 in cross direction.

Figure 8E:
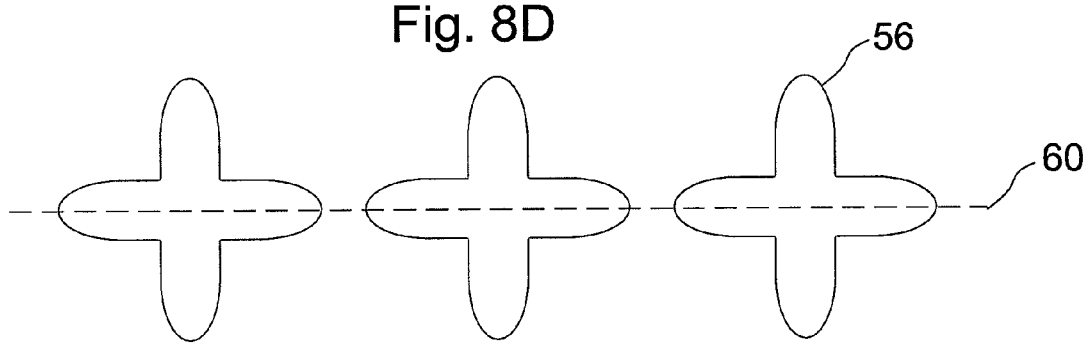
FIG. 8E presents a top view of a fifth type of a groove line according to an embodiment of the invention.

FIG. 8E presents a top view of a fifth type of a groove hole line according to an embodiment of the invention. The fifth type of a groove hole is a cross 56. The groove hole line 60 splits the crosses 56 in half.

Figure 8F:
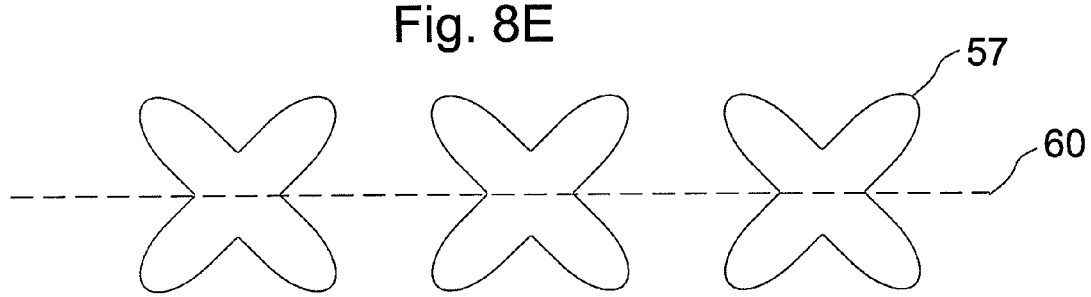
FIG. 8F presents a top view of a sixth type of a groove line according to an embodiment of the invention.

FIG. 8F presents a top view of a sixth type of a groove hole line according to an embodiment of the invention. The sixth type of a groove hole is a rotated cross 57. The groove hole line 60 splits the rotated crosses 57 in half.

As is obvious for a skilled person in the art, the shapes of the groove holes can be any other type than presented in the figures, for example line, triangle, square, polygon, etc. Furthermore, the groove holes need not to be through punched holes. They may also be formed by making recess type of groove holes.

The invention is not limited only to the presented types of electronic products and manufacturing methods containing groove holes for controlling warpage within the electronic products. As a person skilled in the art notices, there can be several types of groove holes and their combinations in controlling warpage of electronic modules.

The invention claimed is:

1. A method of manufacturing an electronic product with decreased warpage, the method comprising:
    manufacturing at least one wiring pattern layer;
    manufacturing at least one insulating material layer;
    forming groove holes to the at least one insulating material layer;
    connecting at least one embedded component to the at least one wiring pattern layer;
    stacking the at least one wiring pattern layer having the at least one embedded component and the at least one insulating material layer having the groove holes on top of each other to form a stacked substrate such that the insulating material layer and the embedded component are on the same side of the wiring pattern layer;
    curing the stacked substrate together with heat and pressure treatment in order to achieve the electronic product with decreased warpage,
    wherein the groove holes are formed to the at least one insulating material layer prior to curing of the stacked substrate; and wherein the groove holes are configured to cut the longitudinal forces caused by reinforcing fibers within the insulating material layer.

2. The method according to claim 1, further comprising: forming the groove holes by laser drilling means.

3. The method according to claim 1, further comprising: forming the groove holes by mechanical means, cutting means, boring means, chemical reacting means or etching means.

4. The method according to claim 1, further comprising: placing the embedded component in an installation cavity formed in at least one insulating material layer.

5. The method according to claim 1, wherein the groove holes are shaped as longitudinal ellipses, transversal ellipses, circles, crosses, rotated crosses, lines, triangles, squares, polygons or as a combination of at least two of the shapes.

6. The method according to claim 1, further comprising: forming the groove holes outside strips and/or between strips of a panel and/or between blocks of a strip and/or between modules of a block and/or between embedded components of a module.

7. The method according to claim 1, wherein a width of the groove holes is between 50 and 300 micrometers.

8. The method according to claim 1, wherein a thickness of the insulating material layers is between 40 and 240 micrometers.

9. The method according to claim 1 wherein, prior to curing the stacked substrate, the groove holes are filled with an adhesive material.

10. The method according to claim 1 wherein the component is a semiconductor component.

* * * * *